United States Patent [19]
Van Andel et al.

[11] Patent Number: 5,287,003
[45] Date of Patent: Feb. 15, 1994

[54] RESIN-ENCAPSULATED SEMICONDUCTOR DEVICE HAVING A PASSIVATION REINFORCEMENT HARD POLYIMIDE FILM

[75] Inventors: Maarten A. Van Andel; Wilhelmus F. M. Gootzen, both of Eindhoven, Netherlands

[73] Assignee: U.S. Philips Corporation, New York, N.Y.

[21] Appl. No.: 24,918

[22] Filed: Mar. 2, 1993

Related U.S. Application Data

[63] Continuation of Ser. No. 840,369, Feb. 24, 1992, abandoned.

[30] Foreign Application Priority Data

Feb. 26, 1991 [NL] Netherlands ................. 9100337

[51] Int. Cl.$^5$ ................. H01L 23/48; H01L 23/28
[52] U.S. Cl. ................. 257/792; 257/787; 257/790
[58] Field of Search .............. 357/72, 74, 80, 84, 357/67, 65; 361/397, 398, 400, 401, 402; 174/52.2, 88 R, 254, 255, 256, 258; 257/787, 788, 790, 792, 795, 791

[56] References Cited

U.S. PATENT DOCUMENTS 4,951,122  8/1990  Tsubosaki et al. ................. 357/72

FOREIGN PATENT DOCUMENTS

| | | |
|---|---|---|
| 0349001 | 1/1990 | European Pat. Off. |
| 61-168944 | 7/1986 | Japan |
| 63-107156 | 5/1988 | Japan |

*Primary Examiner*—Andrew J. James
*Assistant Examiner*—Carl Whitehead, Jr.
*Attorney, Agent, or Firm*—Steven R. Biren

[57] ABSTRACT

A semiconductor device is provided with a polyimide film 21 between the encapsulating synthetic resin 16 and the passivating film 20. If a material having a high hardness (E-modulus $\geq 1.0 \cdot 10^{10}$ Pa) is selected as the polyimide, the number of defects caused by variations in temperature is reduced.

3 Claims, 1 Drawing Sheet

(A)  (B)

(C)

RESIN-ENCAPSULATED SEMICONDUCTOR DEVICE HAVING A PASSIVATION REINFORCEMENT HARD POLYIMIDE FILM

This is a continuation of application Ser. No. 07/840,369, filed Feb. 24, 1992, abandoned.

BACKGROUND OF THE INVENTION

The invention relates to a semiconductor device comprising a semiconductor chip encapsulated in synthetic resin, which chip is provided with a passivating film and a polyimide film which is provided between said passivating film and the synthetic resin.

At present, the vast majority of semiconductor chips or ICs are constructed with a synthetic resin envelope, which synthetic resin is termed encapsulating synthetic resin. In said construction, the chip is completely embedded in synthetic resin. Due to the fact that the synthetic resin and the silicon have different thermal expansion coefficients (TEC), variations in temperature may induce large mechanical stresses in the semiconductor device, in particular when the dimensions of the chip are relatively large as in the case of LSIs (large-scale integrated circuits) and VLSIs (very large-scale integrated circuits). The encapsulating synthetic resin generally consists of an epoxy resin filled with quartz powder or glass powder. The silicon chip is provided with a passivating film on the side of the electronic circuit to preclude the circuit from being damaged and contaminated during further treatment and during its life cycle. Such a passivating film consists, for example, of one or more films of phosphor silicate glass (PSG) or silicon nitride. Due to differences in TEC and the consequential stresses microcracks may be formed in said passivating film. Said stresses and microcracks may also lead to damage to the electronic circuit of the chip, thereby causing functional defects and even failure of the chip. Ambient humidity may reach the chip via the microcracks and cause corrosion. Said defects are customarily reduced by applying a so-called stress-relief film to the passivating film. A synthetic resin such as polyimide and silicone resin is used as the stress-relief film.

A semiconductor device of the type described above is known from European patent application EP-A-0 349 001. An unspecified polyimide film is mentioned as the stress-relief film. A disadvantage of the customary polyimides is the presence of large numbers of cracks in the passivating film after the semiconductor device has been subjected to a thermocycling test. A thermocycling test gives an indication of the reliability of the semiconductor device under operating conditions. The presence of cracks may lead to functional failure of the chip. In a customary thermocycling test 200 semiconductor devices are subjected to a number, for example 1000, of cycles of maintaining the temperature at −65° C. for 30 minutes followed by rapidly heating to 150° C., also for 30 minutes, and conversely. After said test, the percentage of semiconductor devices which have functionally failed is determined. Additionally, in a parallel test the number of cracks in the passivating film is determined per chip after a number of cycles.

In the case of temperature variations, five materials and four interfaces are important, namely the interface between the silicon chip and the metal lead frame; the interface between the synthetic resin envelope and the metal lead frame; the interface between the passivating film and the polyimide film and the interface between the polyimide film and the encapsulating synthetic resin. The stresses occurring in the films and along the interfaces depend on the relevant TEC-values and the moduli of elasticity (E). Additionally, at the location of the metal tracks of the electronic circuit a sixth material plays a part.

SUMMARY OF THE INVENTION

It is an object of the invention to provide, inter alia, a semiconductor device having a substantially reduced sensitivity to the formation of cracks in the passivating film and, hence, an improved reliability and life expectancy of the chip.

According to the invention, this object is achieved by a semiconductor device as described above, which is characterized in that the polyimide film has a modulus of elasticity (E) of at least $1.0 \cdot 10^{10}$ Pa. Such a polyimide is extremely hard in comparison with the customary polyimides which have a modulus of elasticity of approximately $10^9$ Pa. Surprisingly, it has been found that the use of such a hard polyimide results in a substantial reduction of the number of cracks formed in the passivating film during the thermocycling test. Additionally, no functional failure of the chip takes place. The polyimide film can be applied to the passivating film in a simple manner by spin-coating a solution of the corresponding polyamide acid. After evaporation of the solvent and a baking treatment the polyamide acid is converted into polyimide. This is called imidization. In a photolithographic process a number of apertures are formed along the circumference of the polyimide film at the location of the bonding pads of the chip. Said bonding pads are mostly of aluminum. These bonding pads are electrically connected to a lead frame by metal wires. In an alternative embodiment, the film of polyamide acid is patterned lithographically, after which the polyamide acid is converted into polyimide in a baking operation.

Such hard polyimides having $E \geq 1.0 \cdot 10^{10}$ Pa are commercially available, for example PIQ-L100 (Hitachi Chemical Co. Ltd.) and PI-2610 and 2611 (DuPont). The application of such a hard polyimide is not obvious, since the internal stresses in the film caused by temperature variations increase according as the E-value of the film increases. The fact is that the stress generated in a film is proportional to the product of the E-value of said film and the difference in TEC-value between said film and the adjoining film. A possible explanation for a reduction in the number of cracks in the passivating film could be that, as a result of shearing stresses, a hard polyimide film (high E-value) also exhibits less shearing-induced deformation. By virtue of said reduction in deformation, less deformation of the underlying passivating film and of the electronic circuit takes place. As a result thereof, the risk of crack formation in the passivating film and damage to the electronic circuit decreases. The shearing stress is brought about by the large difference in TEC-value between the encapsulating synthetic resin ($\sim 1.3 \cdot 10^{-5} K^{-1}$) and silicon ($\sim 2.3 \cdot 10^{-6} K^{-1}$). With softer polyimide films (lower E-value) the stress building up in the film is slightly smaller, however, the deformation caused by shearing stress is larger. This also causes a substantial deformation of the underlying passivating film and the electronic circuit, so that the risk of damage increases.

It will become apparent from the exemplary embodiment that the use of a hard polyimide film ($E \geq 1.0 \cdot 10^{10}$ Pa) leads to a substantial reduction of the number of cracks in the passivating film after the semiconductor device has been subjected to the thermocycling effect.

In a preferred embodiment of the semiconductor device according to the invention, the thickness of the polyimide film is 1-10 μm. Since such films are applied by spin-coating a polyamide acid solution, the ultimate film thickness is governed by a number of factors such as the rotational speed, the duration of the spin-coating process and the viscosity of the solution. When polyimide PIQ-L100 is used, the ultimate film thickness is 3 μm when spin-coating is carried out for 45 seconds at 2000 revolutions per minute. Films having a smaller thickness require a higher rotational speed and/or a longer duration of the spin-coating process. A practical lower limit of the film thickness is 2 μm. At film thicknesses in excess of 5 μm, the stress in the polyimide film increases which may lead to the above-described defects.

An embodiment of the semiconductor device according to the invention is characterized in that the polyimide film is bonded to the passivating film by means of an aminosilane compound. The passivating film is treated with an aminosilane before the polyimide film is applied to said passivating film. The silyl group reacts with the surface of the passivating film while the amino group reacts with the polyamide acid during the imidization reaction. Suitable aminosilanes are, for example, para-aminophenyl trimethoxysilane (APTM) and N-(2-aminoethyl)-3-aminopropyl trimethoxysilane (AAPS). APTM is provided as an aqueous solution by means of spin-coating, whereas AAPS can be provided via the gas phase. Both silanes provide a satisfactory adhesion between the polyimide and the passivating film, such as silicon nitride, silicon oxynitride, silicon oxide and phosphor silicate glass (PSG).

BRIEF DESCRIPTION OF THE DRAWING

The invention will be explained in greater detail by means of an exemplary embodiment and with reference to the accompanying drawing, in which.

DESCRIPTION OF THE PREFERRED EMBODIMENT

Figure 1:
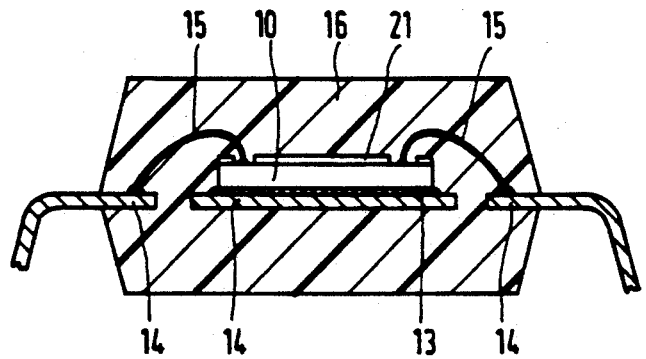
FIG. 1 is a diagrammatic sectional view of a semiconductor device.

FIG. 1 is a diagrammatic sectional view of a semiconductor device. A semiconductor chip 10 of silicon is connected to a lead frame 14 by means of a bonding film 13 (for example silver paste). The lead frame 14 generally consists of a FeNi or CuFe alloy. The chip 10 is connected to the lead frame 14 by metal wires 15 and is covered with a polyimide film 21. Between the chip and the polyimide film there is provided a passivating film (not shown) which generally consists of silicon nitride. The assembly is encapsulated in a synthetic resin 16 which consists mostly of an epoxy resin filled with quartz powder or glass powder.

Figure 2:
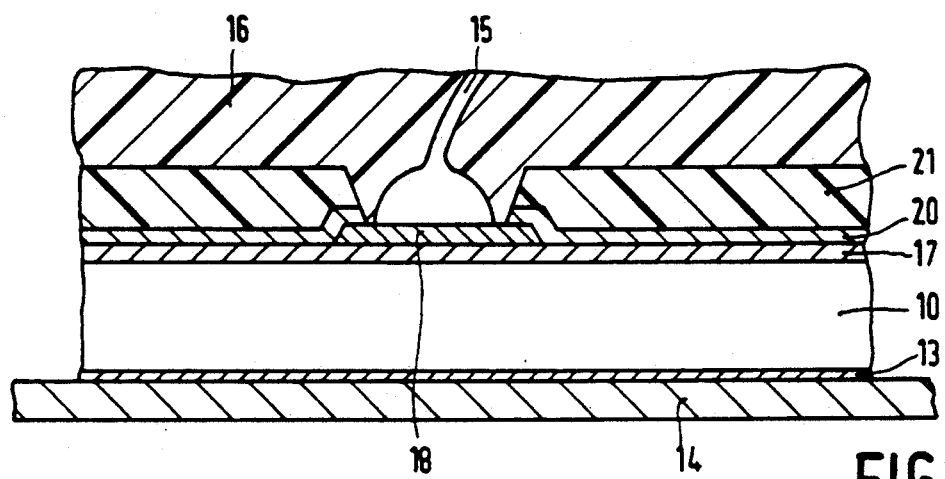
FIG. 2 is a diagrammatic sectional view of a detail of a semiconductor device.

FIG. 2 shows a detail of the semiconductor device of FIG. 1. A silicon oxide film 17 is present on the chip 10. Aluminum bonding pads 18 are present on the silicon oxide. A passivating film 20 of silicon nitride having apertures at the location of the bonding pads 18 is applied to the entire circuit on the chip. The film thickness of the silicon nitride is approximately 1 μm. The silicon nitride film is applied in a PECVD process (=plasma-enhanced chemical vapor deposition).

Figure 3:
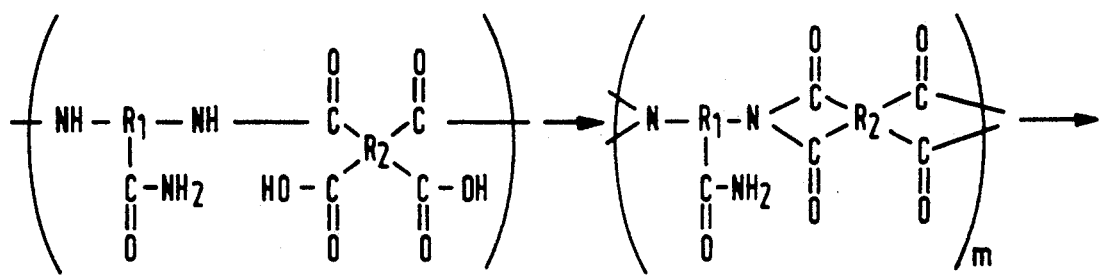
FIG. 3 shows the structural formula of a polyimide used according to the invention and the course of the imidization reaction.
Figure 3:
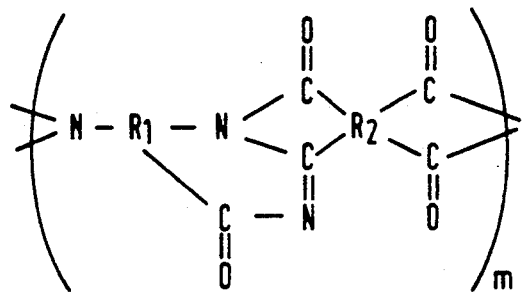

Before applying the polyimide film 21, the silicon wafer which comprises many chips 10 having a silicon nitride film 20 is cleaned with fuming nitric acid. Subsequently, the silicon wafer is subjected to an $O_2$-plasma in a barrel etcher. Next, silanation of the silicon nitride surface takes place using N-(2-aminoethyl)-3-aminopropyltrimethoxysilane (known as A-1120). This takes place from the gas phase at a pressure of 0.013 mbar and a temperature of 140° C. for 4 hours. Subsequently, a film of polyimide "precursor" PIQ-L100 (Hitachi Chemical Co. Ltd.) is spin-coated onto the silanated silicon nitride film 20. This spin-coating process is carried out at 2000 revolutions per minute for 45 seconds. According to the supplier, the polyimide "precursor" PIQ-L100 (a solution of polyamide acid) has a structural formula as shown in FIG. 3A. The group $R_1$ is probably a 1, 3, 4-phenyl group and $R_2$ is probably a $3,3^1,4,4^1$-biphenyl group. The index "m" is such that the weight-averaged molecular weight is 60.000-80.000. Evaporation of the solvent is achieved by a heating step at 90° C. for 2 minutes. In a subsequent heating step at 135° C. for 15 minutes, a partial imidization takes place (FIG. 3B). Partially imidized PIQ-L100 comprises free carboxylic acid groups and can, consequently, be etched by means of an alkaline solution. To obtain apertures in the polyimide film at the location of the bonding pads 18, a positive photoresist film, for example on the basis of novolak/diazonaphtoquinone, is applied to the polyimide film, which photoresist film is then exposed according to a pattern and developed in an aqueous solution of tetramethylammoniumhydroxide TMA (2,5% TMA in water). In this process, also the underlying polyimide is etched at the location of the bonding pads 18. Subsequently, the photoresist film is dissolved in an acetone-water mixture (weight ratio 4:1). Next, the polyimide film is post-cured at a temperature of 320° C. for 30 minutes in a nitrogen atmosphere. In this process, the polyimide obtains the structure as shown in FIG. 3C. The ultimate thickness of the polyimide film 21 is 3 μm. Next, the wafer is divided into chips 10 (dicing) which are mounted onto a lead frame 14. After the wires 15 have been connected to the lead frame 14 and the bonding pads 18, the assembly is encapsulated in an epoxy resin 16. For this purpose, the customary filled epoxy resins can be used, for example EME-6210 (supplier Sumitomo).

The E-value of the polyimide is determined by means of the DMA-technique (Dynamic Mechanical Analysis), which is known per se.

A number of 200 semiconductor devices is subjected to the thermocycling test. In said test, these products are alternately maintained at a temperature of −65° C. for 30 minutes and, next, rapidly heated to a temperature of 150° C. for 30 minutes, and conversely. Said cycle is repeated 1000 or 2000 times. After 2000 times the percentage of semiconductor devices which have functionally failed is determined. In a parallel test, the number of cracks in the silicon nitride film 20 is determined after a number of cycles. By way of comparative example, semiconductor devices are provided with a customary, softer polyimide, namely Probimide 308 and HTR3-100 (supplier Ciba Geigy). The E-value of the polyimide used according to the invention (PIQ-L100) is $1.3 \cdot 10^{10}$ Pa at 0° C., whereas both other polyimides have an E-value of approximately $0.3 \cdot 10^{10}$ Pa. The following Table lists the results of the experiments.

| Polyimide coating | no coating | Probimide 308 | HTR3-100 | PIQ-L100 |
|---|---|---|---|---|
| E ($\times 10^{10}$ Pa) | — | 0,3 | 0,3 | 1,2 |
| failure % after 2000 cycles | >25 | 0 | 0 | 0 |
| number of cracks after: | | | | |
| 10× | | 0 | 0 | 0 |
| 50× | | 13 | 11 | 2 |
| 100× | | 18 | 18 | 4 |
| 200× | 100 | 119 | 104 | 1 |
| 500× | | 122 | 78 | 6 |
| 1000× | | 250 | 130 | 8 |

The second column shows the effect of omitting the polyimide film: the failure percentage is unacceptably high. The Table also shows that the use of a polyimide having an E-value $\geq 1.0 \cdot 10^{10}$ Pa leads to a substantial reduction of the number of cracks in the silicon nitride film 20 (passivating film).

We claim:

1. A semiconductor device comprising a semiconductor chip encapsulated in synthetic resin, said chip having a top surface comprising an electronic circuit and said chip being provided with a passivating film above its top surface and a polyimide film which is provided on top of the passivating film and beneath a portion of the synthetic resin, characterized in that the polyimide film has a modulus of elasticity of at least $1.0 \cdot 10^{10}$ Pa.

2. A semiconductor device as claimed in claim 1, characterized in that the polyimide film has a thickness of 1–10 μm.

3. A semiconductor device as claimed in claim 1, characterized in that the polyimide film is bonded to the passivating film by means of an aminosilane compound.

* * * * *